United States Patent
Wittenbreder, Jr.

(10) Patent No.: US 7,589,571 B1
(45) Date of Patent: Sep. 15, 2009

(54) CAPACITIVELY COUPLED HIGH SIDE GATE DRIVER

(76) Inventor: Ernest Henry Wittenbreder, Jr., 3260 S. Gillenwater Dr., Flagstaff, AZ (US) 86001-8946

( * ) Notice: Subject to any disclaimer, the term of this patent is extended or adjusted under 35 U.S.C. 154(b) by 0 days.

(21) Appl. No.: 12/143,801

(22) Filed: Jun. 22, 2008

Related U.S. Application Data

(60) Continuation of application No. 11/684,754, filed on Mar. 12, 2007, now abandoned, which is a division of application No. 10/944,588, filed on Sep. 18, 2004, now abandoned.

(51) Int. Cl.
*H03K 3/00* (2006.01)
(52) U.S. Cl. .................................. 327/108; 327/110
(58) Field of Classification Search .............. 327/108, 327/109, 110, 111, 112
See application file for complete search history.

(56) References Cited

U.S. PATENT DOCUMENTS

| 4,677,317 A * | 6/1987 | Sakuma | 326/81 |
| 6,489,841 B2 * | 12/2002 | Takagishi | 330/10 |
| 6,836,173 B1 * | 12/2004 | Yang | 327/390 |

* cited by examiner

*Primary Examiner*—Kenneth B. Wells

(57) ABSTRACT

An improved capacitor coupled floating gate drive circuit is revealed that provides an effective drive mechanism for a floating or high side switch without the use of level shifting circuits or magnetic coupling. The capacitor coupled floating gate drive circuit is an improvement over prior art capacitor coupled floating gate drive circuits in that the new circuit uses a positive current feedback mechanism to reject slowly changing voltage variations that cause unintentional switch state changes in prior art capacitor coupled floating gate drive circuits.

4 Claims, 6 Drawing Sheets

CAPACITIVELY COUPLED HIGH SIDE GATE DRIVER

CROSS-REFERENCE TO RELATED APPLICATION

This is a continuation of application Ser. No. 11/684,754, filed 2007 Mar. 12, now abandoned, which was a division of application Ser. No. 10/944,588, filed 2004 Sep. 18, now abandoned.

BACKGROUND OF THE INVENTION

1. Field of the Invention

The subject invention generally pertains to electronic power conversion circuits, and more specifically to high frequency, switched mode electronic power converters.

2. Description of Related Art

FIG. 1 illustrates a ZVS coupled inductor buck converter employing a simple capacitor coupled floating drive circuit for driving a high side power mosfet switch, $M_{AUX}$. The floating drive circuit is powered by a floating bootstrap capacitor, $C_{BOOT}$, that is charged through $D_{BOOT}$ during the on time of the main switch, $M_{MAIN}$. When the PWM drive signal for the main switch $M_{MAIN}$ goes low the main switch turns off and the same PWM drive signal that turns off the main switch is transmitted via $C_{AUX}$ to the input of the inverting gate driver IC, $U_{AUX}$, forcing the output of the inverting gate driver IC, $U_{AUX}$, to go high, turning on the auxiliary switch, $M_{AUX}$. During this transition the source voltage of the auxiliary switch $M_{AUX}$ is rising quickly, which forces the input to $U_{AUX}$ low relative to the floating ground reference terminal of $U_{AUX}$, due to the coupling capacitor $C_{AUX}$ which, absent any change in the PWM drive signal, tries to hold the input terminal of $U_{AUX}$ fixed with respect to primary circuit ground. The input signal to $U_{AUX}$ is held low during the switching transition as a result of the voltage rise of the source of $M_{AUX}$ during the switching transition after $U_{AUX}$ initially changes state as a result of the drive signal provided to turn off the main switch. The clamp diodes at the input to $U_{AUX}$ prevent the input voltage to $U_{AUX}$ from exceeding the supply voltage rails of $U_{AUX}$ and the resistor $R_{AUX}$ limits the current in the clamp diodes to a current less than their maximum current rating during the switching transitions.

When the PWM drive signal to the main switch goes high, this same PWM gate drive signal is transmitted to the input of $U_{AUX}$ by $C_{AUX}$, which results in the output of $U_{AUX}$ going low which turns off $M_{AUX}$ at the same instant that $M_{MAIN}$ is turned on. During the subsequent switching transition the source voltage of $U_{AUX}$ falls rapidly, which forces the input to $U_{AUX}$ high, relative to the floating ground reference terminal of $U_{AUX}$, due to the coupling capacitor, $C_{AUX}$, which, absent any changes in the PWM drive signal, tries to hold the input to $U_{AUX}$ fixed with respect to the primary circuit ground. A high input signal to $U_{AUX}$ results from the voltage fall of the source of $M_{AUX}$ during the switching transition after $U_{AUX}$ initially changes state as a result of the drive signal provided to turn on the main switch. The capacitor coupled floating drive circuit of FIG. 1 works well when the source voltage of $M_{AUX}$ does not change during the on time of $M_{AUX}$. A drop in voltage at the source of $M_{AUX}$ during the on time of $M_{AUX}$ can turn off $M_{AUX}$, which would be an undesirable result.

FIG. 1 illustrates a ZVS coupled inductor buck converter employing a simple floating drive circuit based on capacitor coupling to an inverting driver integrated circuit (IC), $U_{AUX}$. This floating drive circuit works well where the input source voltage is invariant, but the circuit can change state if there are voltage variations of the input source during the time that the switch $M_{AUX}$ is turned on causing erratic operation, power losses, and, in some cases, component failure. What is needed is a similar simple floating drive circuit that is tolerant of voltage variations of the input source.

OBJECTS AND ADVANTAGES

An object of the subject invention is to reveal a simple capacitor coupled gate drive circuit that is tolerant of voltage variations at the source terminal of the high side switch during the on time of the high side switch.

Further objects and advantages of my invention will become apparent from a consideration of the drawings and ensuing description.

These and other objects of the invention are provided by a novel simple capacitor coupled floating drive circuit that is tolerant of voltage variations at the terminals of the high side switch.

SUMMARY

The subject invention reveals an improved capacitor coupled floating high side gate drive circuit for driving a high side transistor switch that is tolerant of variations in the reference voltage of the high side switch.

DESCRIPTION OF THE PREFERRED EMBODIMENTS

Figure 1:
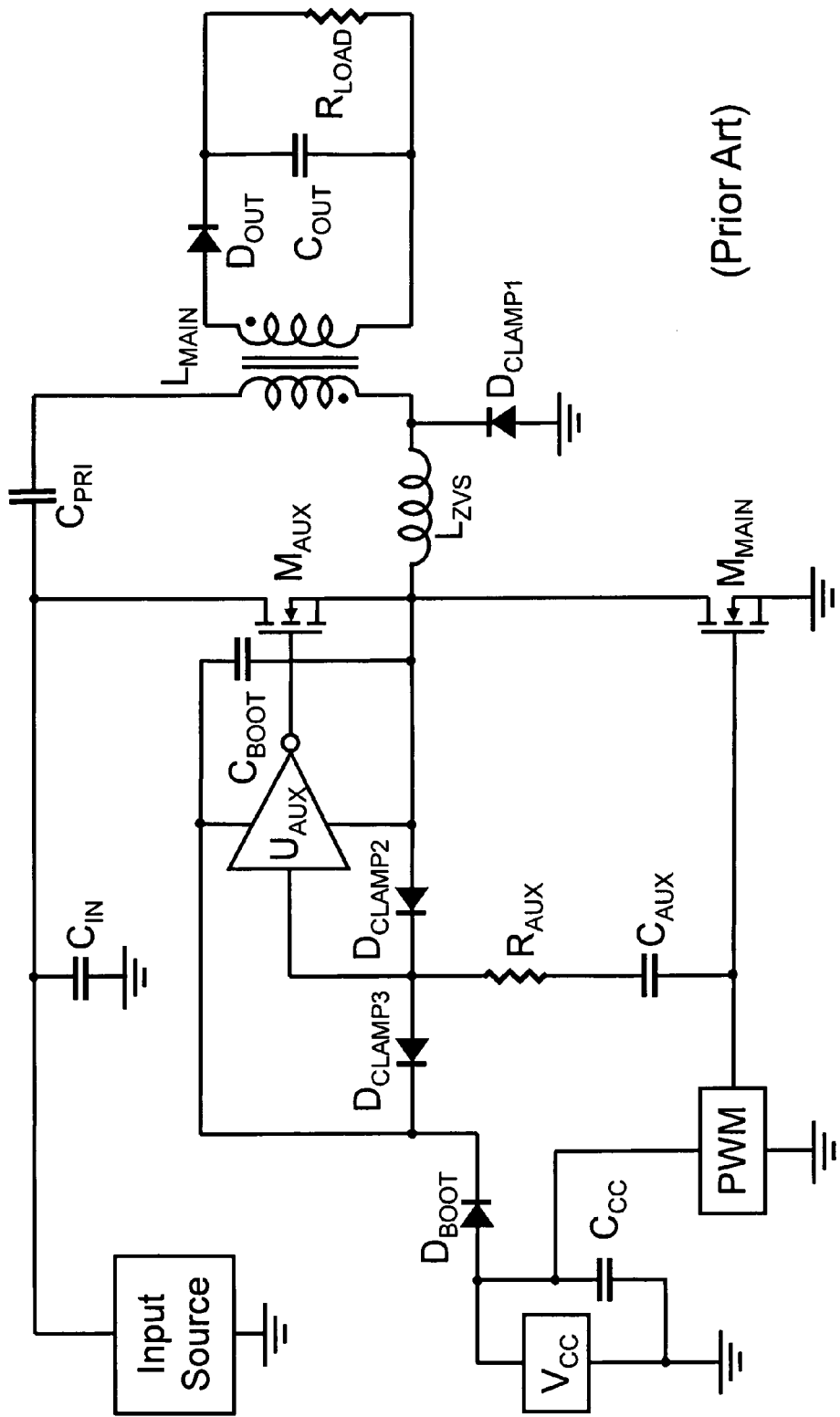
FIG. 1 illustrates a ZVS coupled inductor buck converter with a capacitor coupled floating drive circuit according to the prior art.
Figure 2:
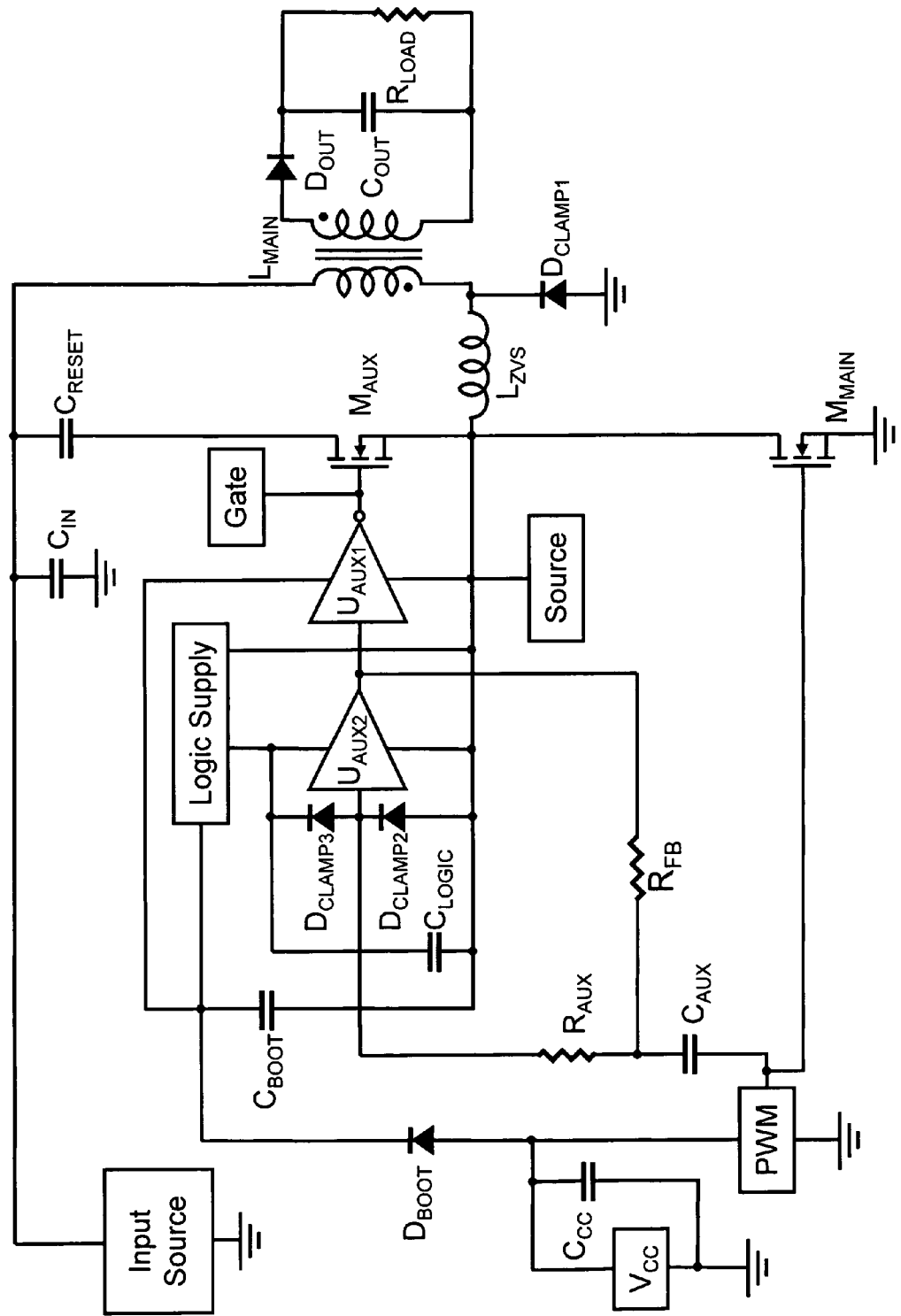
FIG. 2 illustrates a ZVS active clamp flyback converter employing a capacitor coupled floating drive circuit according to the subject invention.
Figure 3:
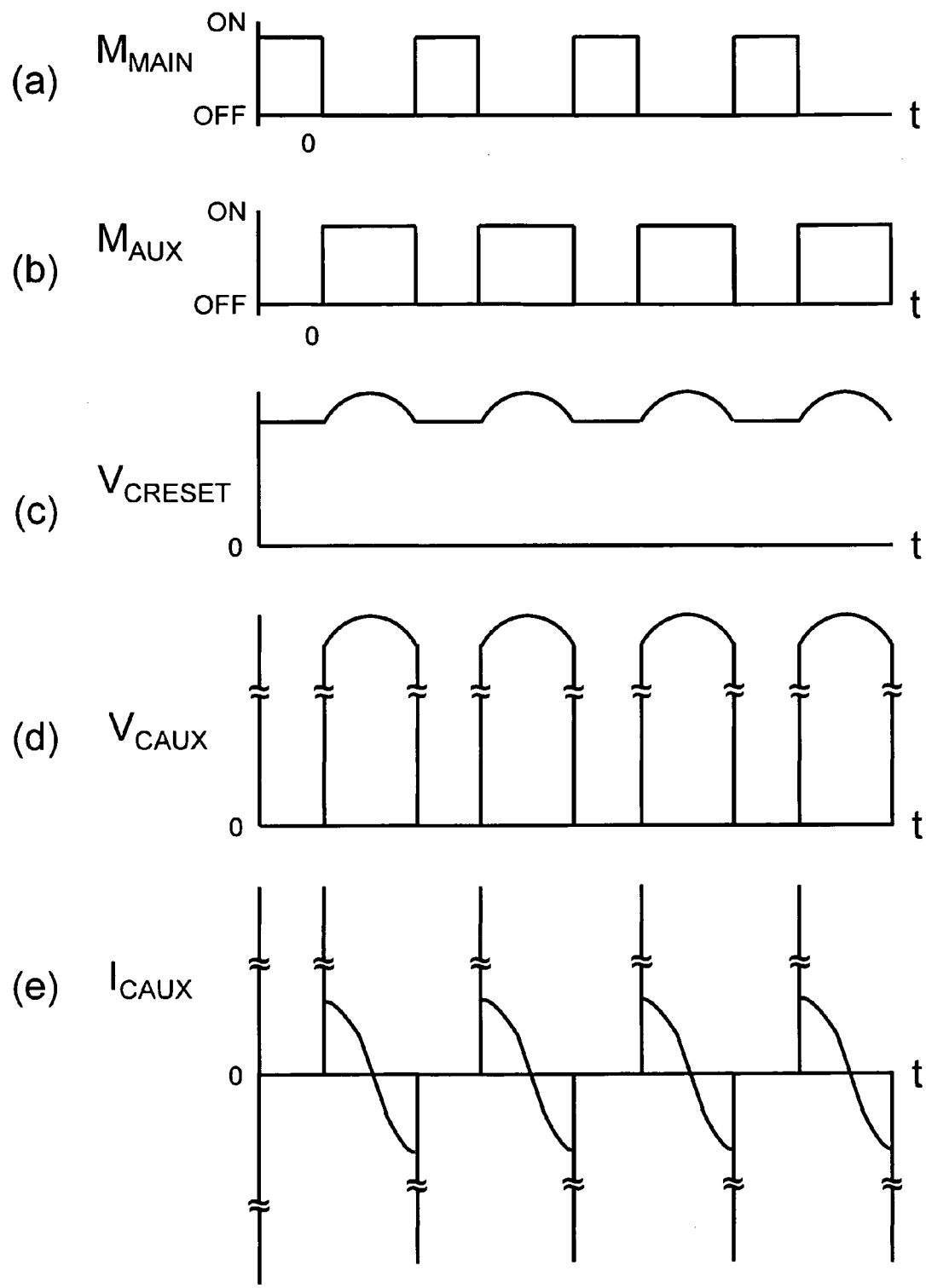
FIG. 3(a) illustrates a timing wave form for the main switch of the FIG. 2 circuit according to the subject invention.
FIG. 3(b) illustrates a timing wave form for the auxiliary switch of the FIG. 2 circuit according to the subject invention.
FIG. 3(c) illustrates a voltage wave form for the reset capacitor of the FIG. 2 circuit according to the subject invention.
FIG. 3(d) illustrates a voltage wave form of the floating drive coupling capacitor of the FIG. 2 circuit according to the subject invention.
FIG. 3(e) illustrates a current wave form of the floating drive coupling capacitor of the FIG. 2 circuit according to the subject invention.

FIG. 2 is a ZVS active clamp flyback converter employing an improved capacitor coupled floating digital logic and drive circuit, which adds a non-inverting buffer $U_{AUX2}$ and a positive current feedback resistor $R_{FB}$ to the capacitor coupled floating drive circuit of FIG. 1. The improved capacitor coupled floating drive circuit is powered by a bootstrap capacitor $C_{BOOT}$ which is charged through a bootstrap diode $D_{BOOT}$ during the on time of the main switch $M_{MAIN}$. Although it may not be necessary, it is preferred that the input to $U_{AUX2}$ be a Schmitt trigger input. A Schmitt trigger input is an input with a variable threshold voltage incorporating hysteresis, so that, when the input is high, the threshold voltage for a change of state is lower than the threshold voltage for a change of state when the input is low. The use of a Schmitt trigger input is typically without cost since these are readily available and no more expensive than standard input logic integrated circuits. FIG. 3(a) illustrates the switch timing of the main switch $M_{MAIN}$ in FIG. 2 and FIG. 3(b) illustrates the switch timing for the auxiliary switch $M_{AUX}$ of FIG. 2. A turn off transition of the main switch $M_{MAIN}$ begins when the PWM drive signal, a digital voltage source, changes from a high state to a low state. The same PWM drive signal for the main switch $M_{MAIN}$ is transmitted to the input of $U_{AUX2}$ through $C_{AUX}$ and $R_{AUX}$, which causes the output of $U_{AUX2}$ to go low and the output of $U_{AUX1}$ to go high, which turns on the auxiliary switch $M_{AUX}$. When the auxiliary switch $M_{AUX}$ is turned on, current at first flows into the capacitor, $C_{RESET}$, through $M_{AUX}$. After the switch $M_{AUX}$ is turned on, the current in $C_{RESET}$ drops until the current reaches zero and reverses direction and increases to a current equal in magnitude, but opposite in direction, to the $C_{RESET}$ current at the beginning of the on time of $M_{AUX}$. As a result of the current in $C_{RESET}$, the voltage of $C_{RESET}$ changes, as illustrated in FIG. 3(c). As a result of the changing voltage in $C_{RESET}$ the voltage at the source terminal of $M_{AUX}$, during the on time of $M_{AUX}$, also changes with the $C_{RESET}$ voltage. There is a corresponding change in $C_{AUX}$ voltage during the on time of $M_{AUX}$, as illustrated in FIG. 3(d), which creates a corresponding current in $C_{AUX}$, as illustrated in FIG. 3(e). The current in $C_{AUX}$ also flows in $R_{AUX}$ and $R_{FB}$. Some of the $C_{AUX}$ current flows in $R_{AUX}$ and $D_{CLAMP2}$, as the $C_{RESET}$ and $C_{AUX}$ voltages rise during the on time of $M_{AUX}$. During this time some of the current also flows in $R_{FB}$, but there is no change of state of $U_{AUX2}$ during this time period because both the input and output of $U_{AUX2}$ remain in the low state. The current in $C_{AUX}$ forces the input of $U_{AUX2}$ lower, thereby forward biasing $D_{CLAMP2}$. Eventually the current in $M_{AUX}$ and $C_{RESET}$ reaches zero and reverses, at which time the current flowing in $C_{AUX}$ also reverses and significant current no longer flows in $R_{AUX}$, since the input impedance of $U_{AUX2}$ is very high and current in $R_{AUX}$ reverse biases $D_{CLAMP2}$. For a typical integrated circuit buffer the input resistance is in the range of teraohms ($10^{12}$ ohms) so that the current in $R_{AUX}$ is zero, for all practical purposes, after the current in $C_{RESET}$ reverses direction. The $C_{AUX}$ current will flow in $R_{FB}$ and the $U_{AUX2}$ input voltage will rise due to the IR drop of $R_{FB}$ after the current in $C_{RESET}$ reverses direction. For a typical active clamp flyback converter the voltage change of the reset capacitor is larger, usually much larger, than the logic supply voltage, so that, without $R_{FB}$, the voltage change of $C_{RESET}$ and $C_{AUX}$, when the switch $M_{AUX}$ is on and the voltage of $C_{RESET}$ and $C_{AUX}$ are decreasing, is more than sufficient to cause $U_{AUX2}$ to change state, which would result in the unintentional turn off of $M_{AUX}$. With $R_{FB}$ in place the current in $C_{AUX}$ creates a rise in $U_{AUX2}$ input voltage, but the rise in $U_{AUX2}$ input voltage will be insufficient to cause a change of state in $U_{AUX2}$, unless the value of $R_{FB}$ is too large. $U_{AUX2}$ will change state if the $U_{AUX2}$ input voltage reaches a threshold voltage, $V_{Threshold}$. For a Schmitt input buffer with +5 volt logic supply voltage a typical minimum threshold voltage, $V_{Threshold}$, is about 2.5 volts. The current in $C_{AUX}$, $I_{CAUX}$, depends on the rate of voltage change of $C_{AUX}$, $$\frac{dV_{CAUX}}{dt},$$

and is given by $$I_{CAUX} = C_{AUX} * \frac{dV_{CAUX}}{dt},$$

where $C_{AUX}$ is the capacitance value of $C_{AUX}$. The rate of voltage change of $C_{AUX}$, $$\frac{dV_{CAUX}}{dt},$$

is related to the rate of voltage change of $C_{RESET}$, $$\frac{dV_{CRESET}}{dt} \cdot \frac{dV_{CAUX}}{dt} \leq \frac{dV_{CRESET}}{dt}$$

and the equality applies when $R_{FB}=0$, so that, in general $$\frac{dV_{CAUX}}{dt} < \frac{dV_{CRESET}}{dt}.$$

The current in $C_{RESET}$ is given by $$I_{CRESET} = C_{RESET} * \frac{dV_{CRESET}}{dt},$$

where $IC_{RESET}$ is the current in $C_{RESET}$ and $C_{RESET}$ is the capacitance value of $C_{RESET}$. The maximum rate of change of voltage for $C_{RESET}$ and $C_{AUX}$ will occur at maximum load and minimum line voltage and results in the maximum peak current, $I_{PEAK}$, in $M_{MAIN}$ and $L_{ZVS}$, which can be determined from circuit component values, the maximum load, and the minimum line voltage. A maximum value for $$\frac{dV_{CRESET}}{dt}$$

and $$\frac{dV_{CAUX}}{dt}$$

can be determined based on $I_{PEAK}$ and is given by $$\frac{dV_{CAUX}}{dt} < \frac{dV_{CRESET}}{dt} \leq \frac{I_{PEAK}}{C_{RESET}}.$$

If the voltage drop in $R_{FB}$ is always less than the $U_{AUX2}$ input threshold voltage, $V_{Threshold}$, then unintentional state changes of $U_{AUX2}$ can be prevented. The voltage of $R_{FB}$ is given by $$V_{RFB} = I_{CAUX} * R_{FB} = R_{FB} * C_{AUX} * \frac{dV_{CAUX}}{dt} \leq$$

$$R_{FB} * C_{AUX} * \frac{dV_{CRESET}}{dt} \leq \frac{R_{FB} * C_{AUX} * I_{PEAK}}{C_{RESET}},$$

where $V_{RFB}$ is the voltage of $R_{FB}$ and $R_{FB}$ is the resistance value of $R_{FB}$. If $R_{FB}$ were equal to zero then there could be no changes of state to $U_{AUX2}$, but this is undesirable since it is desired to change the state of $M_{AUX}$, which requires that $U_{AUX2}$ also change state. $R_{FB}$ needs to be sufficiently small to reject $U_{AUX2}$ changes of state due to $C_{RESET}$ voltage drops during the on time of $M_{AUX}$, but sufficiently large to enable intentional state changes of $U_{AUX2}$ when the PWM drive source, which is a digital voltage source, changes state. During the on time of $M_{AUX}$, in order to avoid unintentional turn off of $M_{AUX}$, we must have $V_{RFB} < V_{Threshold}$ which can be achieved if $$R_{FB} < \frac{V_{Threshold} * C_{RESET}}{I_{PEAK} * C_{AUX}}.$$

As a numerical example, for a 150 watt off line active clamp flyback converter under development at the time of this writing, $V_{Threshod}$=2.5 volts, $I_{PEAK}$=3 amperes, $C_{AUX}$=5 picofarads, and $C_{RESET}$=220 nanofarads, so that $R_{FB}$ must be less than 36 kiloohms. In the circuit under development $R_{FB}$ must be larger than 3 kiloohms in order to provide a change of voltage greater than the threshold voltage at the $U_{AUX2}$ input in response to a change of state of the PWM drive source. In the current example a $R_{FB}$ value near the geometric mean of the minimum and maximum acceptable values can be chosen and reliable operation can be expected with ample margins. If the range of acceptable values of $R_{FB}$ is too narrow or non-existent then the situation can be most easily remedied by increasing $C_{RESET}$. Alternate remedies are increasing $V_{Threshold}$ and reducing $I_{PEAK}$, but both of the alternate remedies involve other consequences to the circuit operation and cost that may be unacceptable or much more difficult to achieve. Decreasing $C_{AUX}$ increases both the minimum acceptable value of $R_{FB}$ and increases the maximum acceptable value of $R_{FB}$, so that decreasing $C_{AUX}$ has no benefit to the problem of insufficient range of acceptable $R_{FB}$ values.

A turn on transition of the main switch $M_{MAIN}$ begins when the PWM drive signal changes from a low state to a high state. The PWM drive signal is transmitted to the $U_{AUX2}$ input via $C_{AUX}$, which forces the output of $U_{AUX2}$ to a high state and forces the output of $U_{AUX1}$ to a low state, thereby turning off $M_{AUX}$. During the turn on transition of $M_{MAIN}$ the source voltage of $M_{AUX}$ falls rapidly, which has the result of forcing the input of $U_{AUX2}$ high, discharging $C_{AUX}$ through $R_{AUX}$ and $D_{CLAMP3}$, and reinforcing the change initiated by the change in state of the PWM drive signal. During the on time of $M_{MAIN}$, the source voltage of $M_{AUX}$ is held at the primary ground potential or zero volts for the duration of the on time of $M_{MAIN}$. During the on time of $M_{MAIN}$, there is no change in the $M_{AUX}$ source voltage and no mechanism in play to cause an unintentional change of state in $M_{AUX}$.

Figure 4:
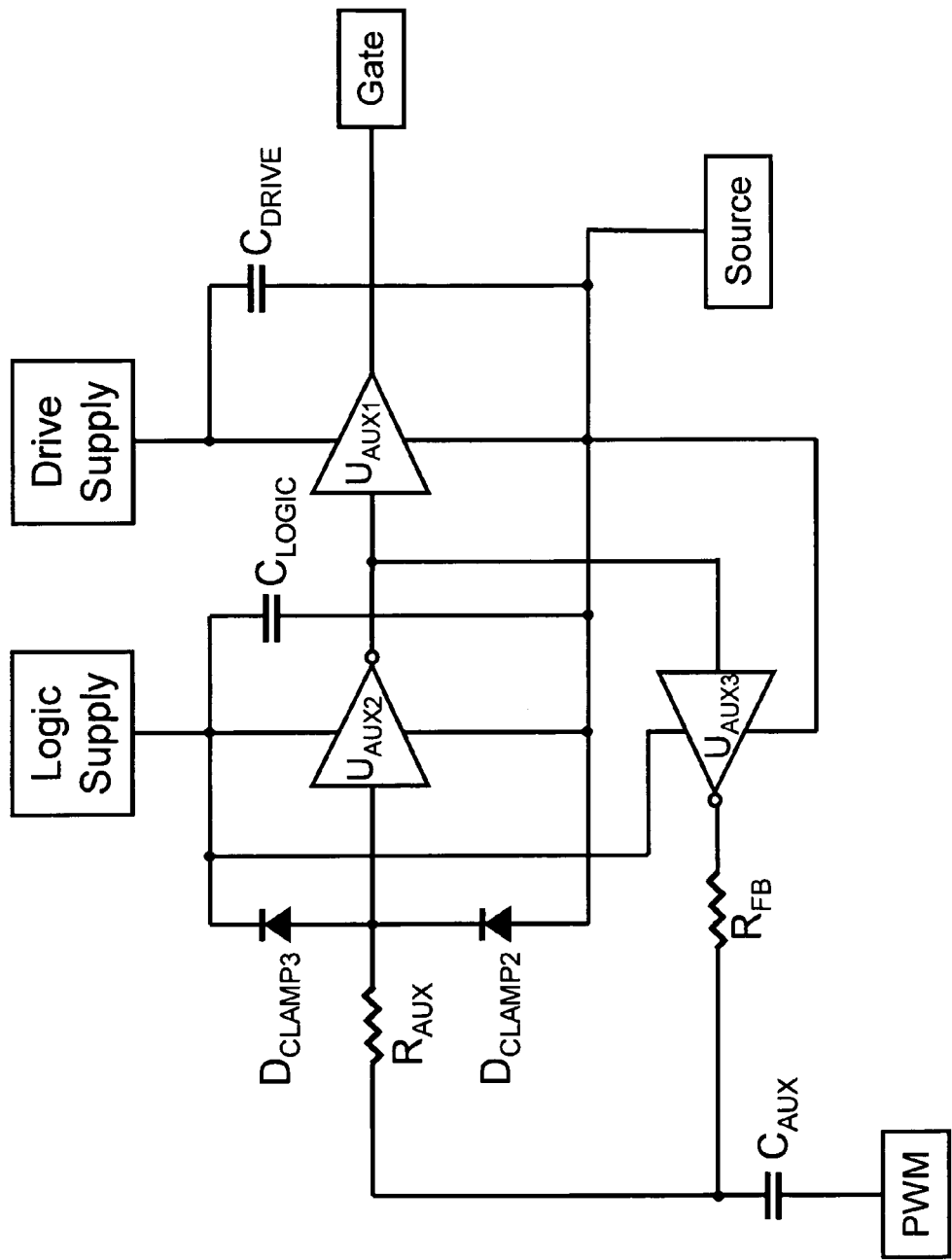
FIG. 4 illustrates a variation of the capacitor coupled floating drive circuit of FIG. 2 according to the subject invention.
Figure 5:
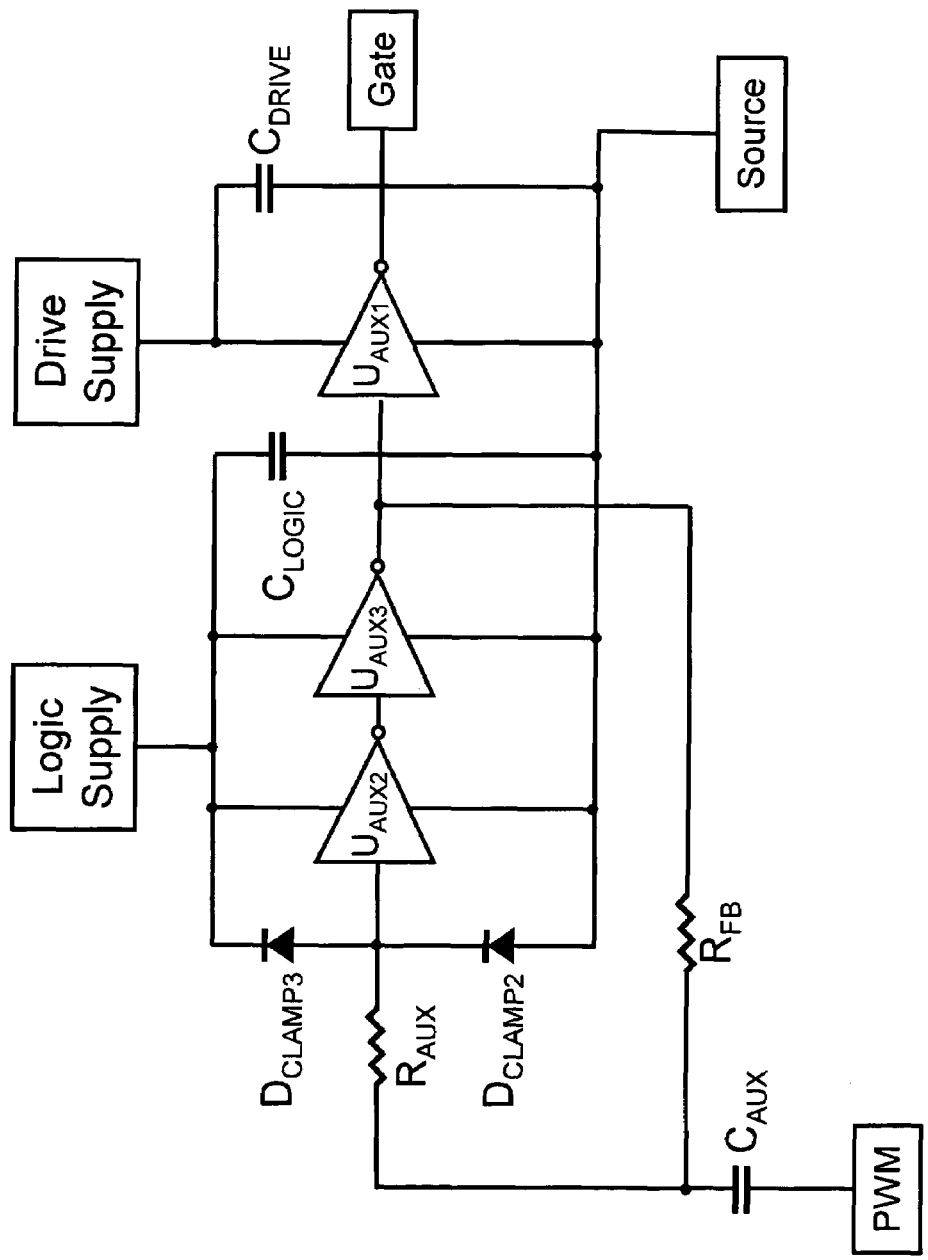
FIG. 5 illustrates a second variation of the capacitor coupled floating drive circuit of FIG. 2 according to the subject invention.

FIG. 4 illustrates an alternate arrangement of the capacitor coupled floating drive circuit of the subject invention wherein two inverting gates are used to provide the positive current feedback via $R_{FB}$ and a non-inverting gate driver IC is used in place of the inverting gate driver IC of FIG. 2. Another alternate arrangement is illustrated in FIG. 5. In the FIG. 5 arrangement two inverters are used with an inverting gate driver IC to achieve the same results achieved in the FIG. 2 and FIG. 4 circuits, except that the propagation delay of the FIG. 5 circuit will be larger since there are three gates connected in series in FIG. 5 versus two in series for FIGS. 2 and 4.

Figure 6:
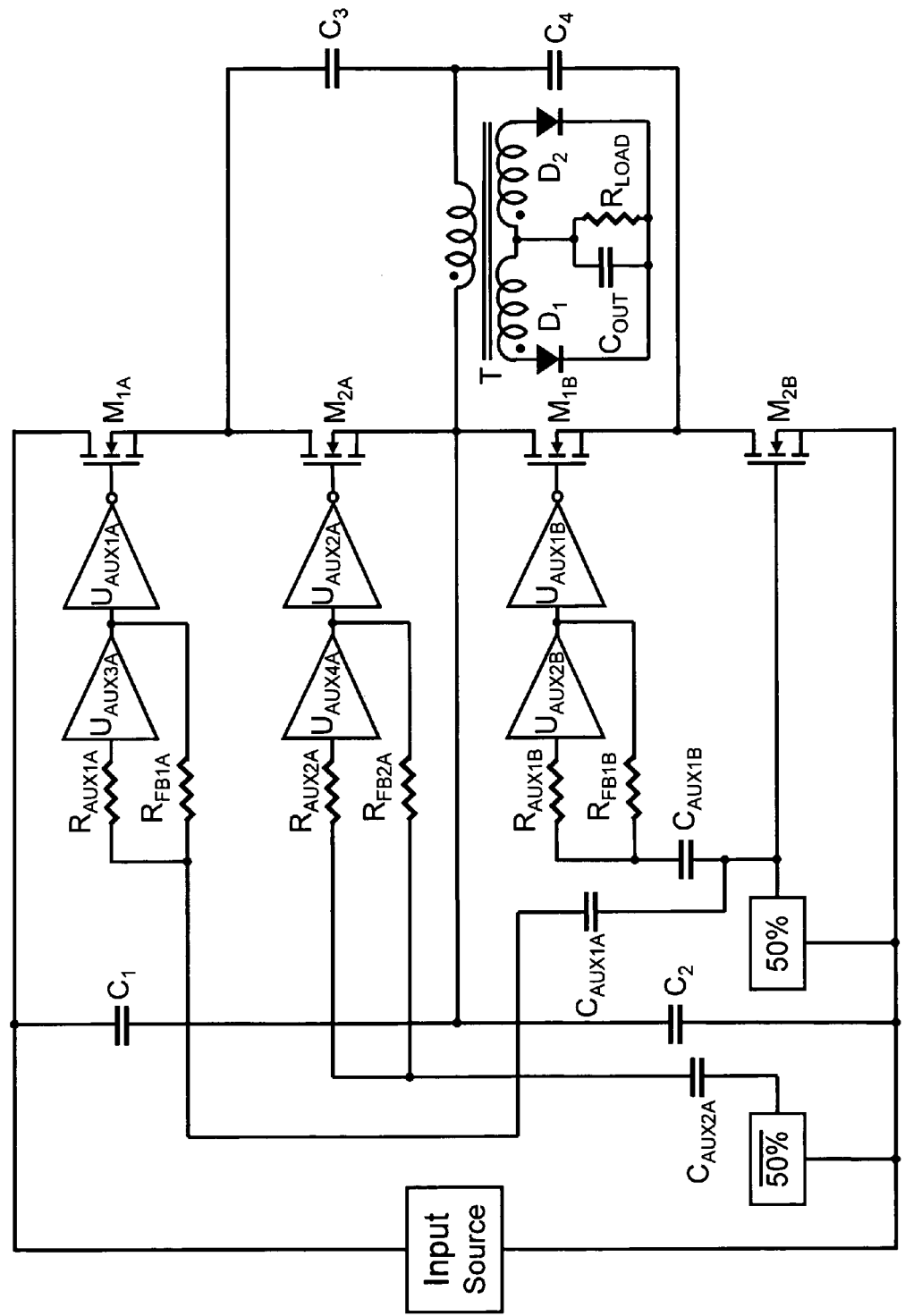
FIG. 6 illustrates a dc transformer circuit employing a quarter bridge primary network together with three of the capacitor coupled floating drive circuits of the subject invention used to drive the three high side switches of the quarter bridge circuit.

FIG. 6 illustrates the use of the capacitor coupled floating drive circuit in a quarter bridge dc transformer circuit, according to the subject invention. The capacitor coupled floating drive circuit revealed in FIG. 2 is applied to the three high side switches in the quarter bridge primary switching network. The drive signal for the single low side switch $M_{2B}$ is used to provide the input for the $M_{1A}$ and $M_{1B}$ switches. An inverted low side drive source must be added, as shown, to provide the input drive signal for the $M_{2A}$ high side switch. The use of the capacitor coupled floating drive circuits of the subject invention in the quarter bridge primary switching network provides an inexpensive and reliable gate drive solution that is insensitive to voltage variations resulting from the charging and discharging of the circuits capacitors.

CONCLUSION, RAMIFICATIONS, AND SCOPE OF INVENTION

Thus the reader will see that an improved capacitor coupled floating drive circuit can be formed by providing a novel positive current feedback mechanism that results in the rejection of slowly varying currents that could otherwise cause an unintentional change in state of a high side switch.

While my above description contains many specificities, these should not be construed as limitations on the scope of the invention, but rather, as exemplifications or preferred embodiments thereof. Many other variations are possible. For example, many other digital networks that provide a similar positive current feedback mechanism for a capacitor coupled floating drive circuit are possible.

Accordingly, the scope of the invention should be determined not by the embodiments illustrated, but by the appended claims and their legal equivalents.

I claim:

1. A capacitor coupled floating gate drive circuit comprising,
   a digital voltage source having two discrete operating voltage states separated by a substantially fixed dc voltage difference,
   a capacitor directly connected in series with said digital voltage source,
   a digital logic and drive circuit responsive to said digital voltage source, having at least an input terminal coupleable to said capacitor, a first output terminal, a second output terminal coupleable to a gate terminal of a mosfet, a first supply voltage terminal, and a reference terminal coupleable to a source terminal of said mosfet, wherein a voltage signal appearing at said first output terminal is substantially in synchronization with a voltage applied at said input terminal and a voltage signal appearing at said second output terminal is substantially in anti-synchronization to said voltage applied at said input terminal, a first resistor having two terminals with said first terminal of said first resistor coupled to said first output of said digital logic and drive circuit and said second terminal of said first resistor coupled to said capacitor, wherein said first resistor provides positive current feedback to said input terminal of said digital logic and drive circuit from said first output terminal of said digital logic and drive circuit, a first clamp diode having an anode terminal and a cathode terminal with said anode terminal of said first clamp diode directly connected to said input terminal of said digital logic and drive circuit and said cathode terminal of said first clamp diode directly connected to said first supply voltage terminal of said digital logic and drive circuit, a second clamp diode having an anode terminal and a cathode terminal with said cathode terminal of said second clamp diode directly connected to said input terminal of said digital logic and drive circuit and said anode terminal of said second clamp diode directly connected to said reference terminal of said digital logic and drive circuit, whereby said first resistor provides positive current feedback for reducing the responsiveness of said digital logic and drive circuit to charging or discharging currents of said capacitor, thereby preventing a change in logic state of said digital logic and drive circuit not commanded by said digital voltage source.

2. The capacitor coupled floating gate drive circuit of claim 1 wherein said input of said digital logic and drive circuit is a Schmitt trigger input.

3. The capacitor coupled floating gate drive circuit of claim 1 wherein said clamp diodes are integrated into said digital logic and drive circuit.

4. The capacitor coupled floating gate drive circuit of claim 1 further comprising a second resistor having two terminals with said first terminal of said second resistor coupled to said capacitor and with said second terminal of said second resistor coupled to said input terminal of said digital logic and drive circuit, whereby said second resistor provides current limiting to protect said first and second clamp diodes from over current associated with applied voltage changes to said capacitor.

* * * * *